United States Patent
Goma et al.

(12)
(10) Patent No.: US 6,388,517 B1
(45) Date of Patent: May 14, 2002

(54) INPUT CHANGE-OVER TYPE AMPLIFIER AND FREQUENCY CHANGE-OVER TYPE OSCILLATOR USING THE SAME

(75) Inventors: Shinji Goma, Ishikawa-ken; Yoshiyuki Mashimo, Komatsu, both of (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/598,390

(22) Filed: Jun. 21, 2000

(30) Foreign Application Priority Data

Jun. 23, 1999 (JP) .......................................... 11-177179

(51) Int. Cl.$^7$ ................................................. H03F 3/04
(52) U.S. Cl. ......................... 330/147; 330/283; 331/49
(58) Field of Search ................................. 330/147, 281, 330/283, 302; 331/49

(56) References Cited

U.S. PATENT DOCUMENTS 4,314,374 A * 2/1982 Kuhn ..................... 332/155 X

FOREIGN PATENT DOCUMENTS

JP          62-128205      *  6/1987    ................. 330/283

* cited by examiner

Primary Examiner—Steven J. Mottola
(74) Attorney, Agent, or Firm—Burns, Doane, Swecker & Mathis, LLP

(57) ABSTRACT

An input change-over amplifier is capable of effecting a change-over in outputting two signals having different frequencies, without lowering the signal levels thereof. Two signals having different frequencies are fed into two input terminals of an amplifying element. When a signal is input through one input terminal, the other input terminal is grounded. When a signal is input through the other input terminal, the above one input terminal is grounded. In this way, it is possible to effect a change-over in outputting two signals having different frequencies, without lowering the signal levels thereof. Further, since two signals can be fed into an amplifying element through different paths, it is not necessary to provide a matching circuit at a connection point of signal paths. Therefore, the number of required electronic parts can be reduced, an oscillator which is compact in size can be manufactured, and a necessary circuit can be designed within only a short time.

3 Claims, 4 Drawing Sheets

FIG. 1
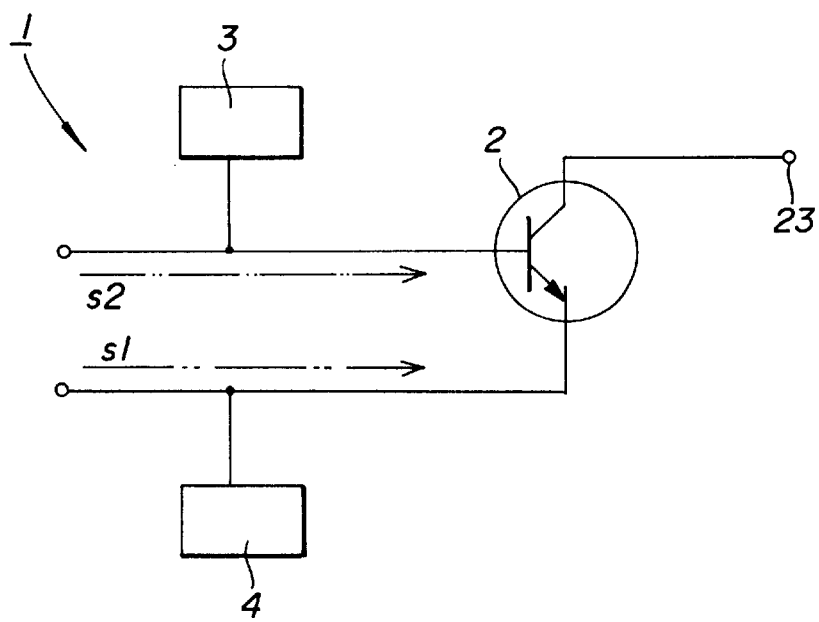
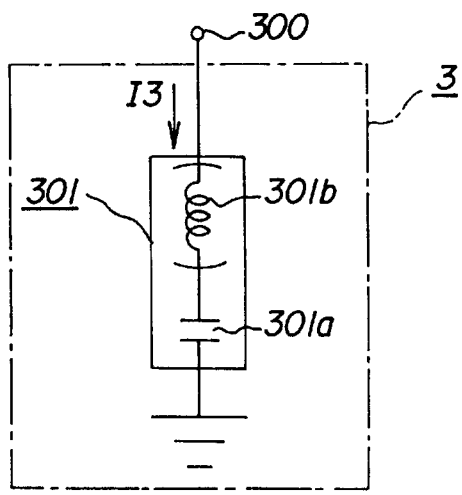
FIG. 2A
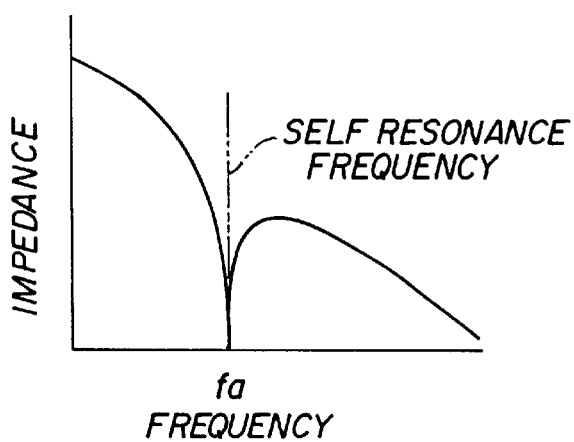
FIG. 2B

INPUT CHANGE-OVER TYPE AMPLIFIER AND FREQUENCY CHANGE-OVER TYPE OSCILLATOR USING THE SAME

BACKGROUND OF THE INVENTION

1. Field of the Invention

The present invention relates to an input change-over type amplifier and a frequency change-over type oscillator formed by using the input change-over type amplifier. In particular, this invention relates to an input change-over type amplifier capable of switching by a switch to amplify and output two signals having different frequencies. The present invention also relates to a frequency change-over type oscillator formed by using such an amplifier.

2. Description of the Related Art

FIG. 6 is an explanatory view schematically indicating a frequency change-over type oscillator 11 made according to a prior art. In fact, a basic principle of the frequency change-over type oscillator 11 shown in FIG. 6 has been disclosed in Japanese Unexamined Patent Publication No. 10-126152.

Referring to FIG. 6, the conventional frequency change-over type oscillator 11 has an input change-over type amplifier 10, a first signal source 51 and a second signal source 52. A transistor 2 of the input change-over type amplifier 10 is an amplifying element. In detail, the base of the transistor 2 serves as an input terminal, its emitter serves as a ground terminal, and its collector serves as an output terminal. In practice, the emitter of the transistor 2 is connected to a grounding circuit 40 which is connected with GND via a ground capacitor 400. The base of the transistor 2 is connected through a connection point 24 to both the first signal source 51 and the second signal source 52. From the first and the second signal sources 51 and 52, either a first high frequency signal s1 or a second high frequency signal s2 is output, so that the signal s1 or the signal s2 is allowed to pass through the connection point 24 so as to be fed into the base of the transistor 2. The ground capacitor 400 of the grounding circuit 40 is so designed that it has a sufficiently small impedance with respect to a high frequency current. Therefore, when a high frequency signal s1 or a high frequency signal s2 is fed to the base of the transistor 2, the transistor 2 becomes grounded through its emitter.

However, with the frequency change-over type oscillator 11 shown in FIG. 6, since a portion of the signal s1 output from the first signal source 51 is transmitted into the second signal source 52, the level of the signal to be input into the base of the transistor 2 is reduced. The same is true with the signal source s2, hence the level of a signal to be input into the base of the transistor 2 is reduced undesirably. Namely, since the two signal sources are both connected with the connection point 24, a signal output from one signal source flows into the other signal source, the level of a signal to be input into the base of the transistor 2 is reduced undesirably. As a result, when the level of a signal to be input into the base of the transistor 2 is lowered, there is a problem that the level of a signal to be output from the collector of the transistor 2 also deteriorates. Moreover, when the level of a signal output from the collector of the transistor 2 becomes low, there is a problem that it will be difficult to ensure a stability with respect to an external load.

In order to solve the above problem, a matching circuit such as a trap circuit or a switch circuit is provided at the connection point 24 of the signal sources so as to obtain a matching in each frequency band. In this way, a signal output from one signal source may be prevented from being transmitted into the other signal source, thereby preventing an undesired decrease in the level of a signal being fed into an amplifying element. However, with the use of such a method, there have been found three problems which may be concluded as follows. A first problem is that it will be difficult to input a signal into an amplifying element without decreasing the level of the respective two signals to be inputted into the amplifying element. A second problem is that extra electronic parts in accordance with the addition of a matching circuit are required, hence it is difficult to reduce the number of the components in the oscillator and miniaturize the oscillator. A third problem is that the designing of the matching circuit becomes a time-consuming work.

SUMMARY OF THE INVENTION

It is an object of the present invention to provide an input switching amplifier and a frequency switching oscillator using the input switching amplifier, in which two signals having mutually different frequencies is inputted into an amplifying element without reducing the levels of the signals, thereby making it sure to produce an output having a high signal level.

It is another object of the present invention to provide an input switching amplifier and a frequency switching oscillator using the input switching amplifier, which does not require a matching circuit such as a trap circuit or a switch circuit at the connection point of two signal sources, thereby making it possible to reduce the number of needed electronic components, so as to produce an oscillator which is compact in size, and thus allowing the designing of necessary circuits in only a shortened time.

In order to achieve the above object, an input change-over type amplifier according to the present invention, comprises: an amplifying element having a first input terminal, a second input terminal, and one output terminal; a first grounding circuit which is connected to the second input terminal and is capable of being grounded at a high frequency with respect to the frequency of a signal being inputted into the first input terminal; a second grounding circuit which is connected to the first input terminal and is capable of being grounded at a high frequency with respect to the frequency of a signal being inputted into the second input terminal.

Further, in the input change-over type amplifier according to the present invention, the first or the second grounding circuit includes a capacitor.

Moreover, in the input change-over type amplifier according to the present invention, a self resonant frequency of the capacitor substantially corresponds with the frequency of a signal being inputted into the first or the second input terminal.

In addition, in the input change-over type amplifier according to the present invention, the first or the second grounding circuit includes a switch member.

Further, a frequency change-over type oscillator according to the present invention, comprises the above described input change-over type amplifier; a first signal source connected with the first input terminal; a second signal source connected with the second input terminal.

With the above constitution of the present invention, i.e., with the input change-over type amplifier and the frequency change-over type oscillator using the same, since two signals having different frequencies are allowed to be inputted into the amplifier via different paths, the two signals can be inputted into the amplifier without decreasing their signal levels, thereby making it possible to obtain an output of a high signal level.

Further, with the above constitution of the present invention, it is not necessary to provide a matching circuit at a connection point of signal paths. Therefore the number of electronic components can be reduced, and it is allowed to produce an oscillator which is compact in size and design a necessary circuit with only a shortened time.

BRIEF DESCRIPTION OF THE DRAWINGS

FIG. 1 is a block diagram schematically showing an embodiment of an input change-over type amplifier according to the present invention;

FIG. 2A shows an example of a first grounding circuit for use in the input change-over type amplifier of FIG. 1;

FIG. 2B is a graph showing a characteristic of the first grounding circuit for use in the input change-over type amplifier of FIG. 1;

DESCRIPTION OF THE PREFERRED EMBODIMENTS

Figure 6:
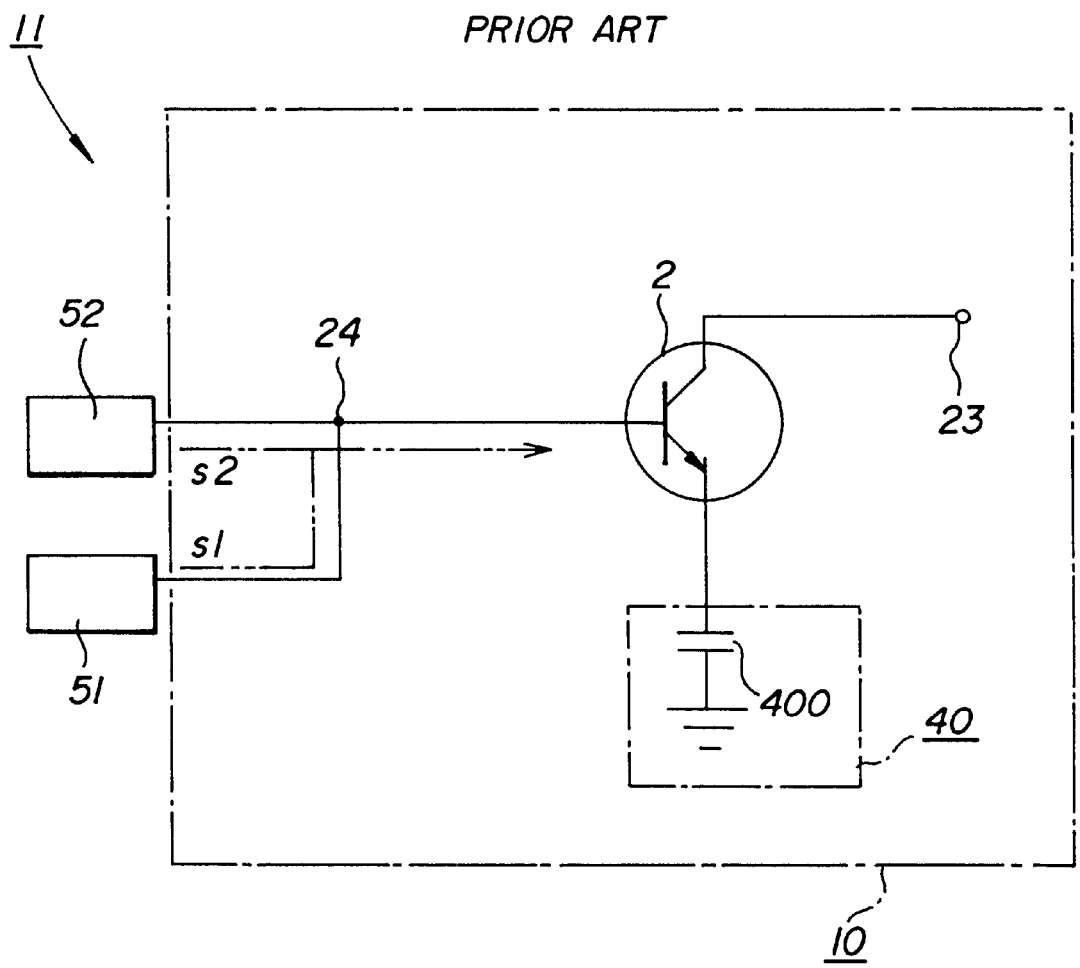
FIG. 6 is a block diagram schematically showing a conventional frequency change-over type oscillator.

FIG. 1 shows an embodiment of an input switching amplifier according to the present invention. In FIG. 1, some elements which are similar to or the same as those in FIG. 6 will be represented by the same reference numerals, and the explanations thereof will not be repeated.

Referring to FIG. 1, an input change-over type amplifier 1 comprises a transistor 2, a first grounding circuit 3 and a second grounding circuit 4. The emitter (serving as a first input terminal) of the transistor 2 is connected to the second grounding circuit 4, while the base (serving as a second input terminal) of the transistor 2 is connected to the first grounding circuit 3. Here, the collector of the transistor 2 is an output terminal.

Now, an example showing the internal structure of the first grounding circuit 3 will be described with reference to FIG. 2 and FIG. 3. Since the internal structure of the second grounding circuit 4 is allowed to be described in the same manner as with the first grounding circuit 3, the detailed description of the second grounding circuit 4 will not be repeated.

A detailed example of the first grounding circuit 3 is shown in FIG. 2A. The first grounding circuit 3 has a capacitor 301 disposed between a ground GND and a terminal 300 connected to the base of a transistor 2, which base serves as a second input terminal of the transistor. The impedance of the capacitor 301 varies in accordance with the frequency of an electric current I3 output from the terminal 300. In general, when the frequency of the current I3 is high, the impedance of the capacitor 301 is small. On the other hand, when the frequency of the current I3 is low, the impedance of the capacitor 301 is large. For this reason, the terminal 300 of the first grounding circuit 3 may be deemed to be grounded at a high frequency when the frequency of the current I3 is sufficiently high. On the other hand, the terminal 300 of the first grounding circuit 3 may be deemed not to be grounded at a high frequency when the frequency of the current I3 is not sufficiently high.

Further, the capacitor 301 has a parasitic inductive component 301b which is connected in series to a capacitive component 301a, and the inductive component 301b and the capacitive component 301a self-resonate. For this reason, since the impedance of the capacitor 301 becomes extremely small in the vicinity of a self resonant frequency fa as shown in FIG. 2B, the terminal 300 of the first grounding circuit 3 may be deemed to be grounded at a high frequency when the frequency of the current I3 is in the vicinity of its self resonant frequency fa.

In the above constitution, the terminal 300 of the first grounding circuit 3 may be deemed to be grounded or not to be grounded in a high frequency manner which depends upon the frequency of the current I3. Accordingly, the base of the transistor 2 connected to the terminal 300 (said base serves as the second input terminal for the transistor) may be used as a ground terminal or a non-ground terminal. Further, the first grounding circuit 3 does not require a switch member for switching between a grounded state and a non-grounded state.

Figure 3:
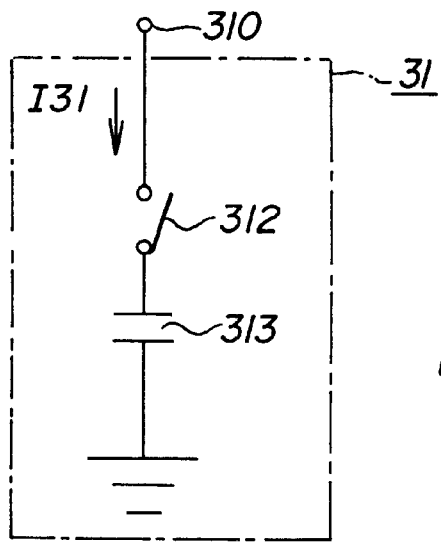
FIG. 3 shows a circuit showing another embodiment of a first grounding circuit.

Next, another detailed example of a first grounding circuit is shown in FIG. 3. Referring to FIG. 3, a first grounding circuit 31 has a switch member 312 disposed between GND and a terminal 310 which is connected to the base of the transistor 2 (said base serves as the second input terminal for the transistor). A ground capacitor 313, which has a sufficiently small impedance with respect to the frequency of an electric current I31 flowing from the terminal 310, can be connected in series to the switch member 312.

The first grounding circuit 31 having the above constitution will be non-grounded when the switch member 312 turns OFF, and will be grounded at a high frequency when the switch member 312 turns ON. Therefore, the base of the transistor 2 connected to the terminal 310 (said base serves as the second input terminal for the transistor) may be used as a ground terminal or a non-ground terminal.

Referring again to FIG. 1, the input change-over type amplifier 1 having the above constitution is so formed that a signal s1 having a frequency f1 is input into the emitter of the transistor 2, while a signal s2 having a frequency f2 is input into the base of the transistor 2. At each time, only one of the signal s1 and the signal s2 is input into the transistor 2. With respect to an electric current having a frequency f1, the first grounding circuit 3 is arranged such that it may be grounded in the high frequency manner, while the second grounding circuit 4 is arranged such that it can be non-grounded in the high frequency manner. Therefore, the signal s1 is input into the emitter of the transistor 2, and the base of the transistor 2 is grounded. Similarly, with respect to an electric current having a frequency f2, the first grounding circuit 3 is arranged such that it can be non-grounded in the high frequency manner, while the second grounding circuit 4 is arranged such that it may be grounded in the high frequency manner. Therefore, the signal s2 is input into the base of the transistor 2, and the emitter of the transistor 2 is grounded.

In this way, since the input change-over type amplifier 1 is arranged such that the signal s1 and the signal s2 are allowed to be input into respective different terminals of the transistor 2, one signal can be prevented from being fed into a path of the other signal before said one signal is fed into an input terminal of the transistor 2. As a result, it is sure to prevent an undesired decrease in the level of a signal being fed into an input terminal of the transistor 2.

Figure 4:
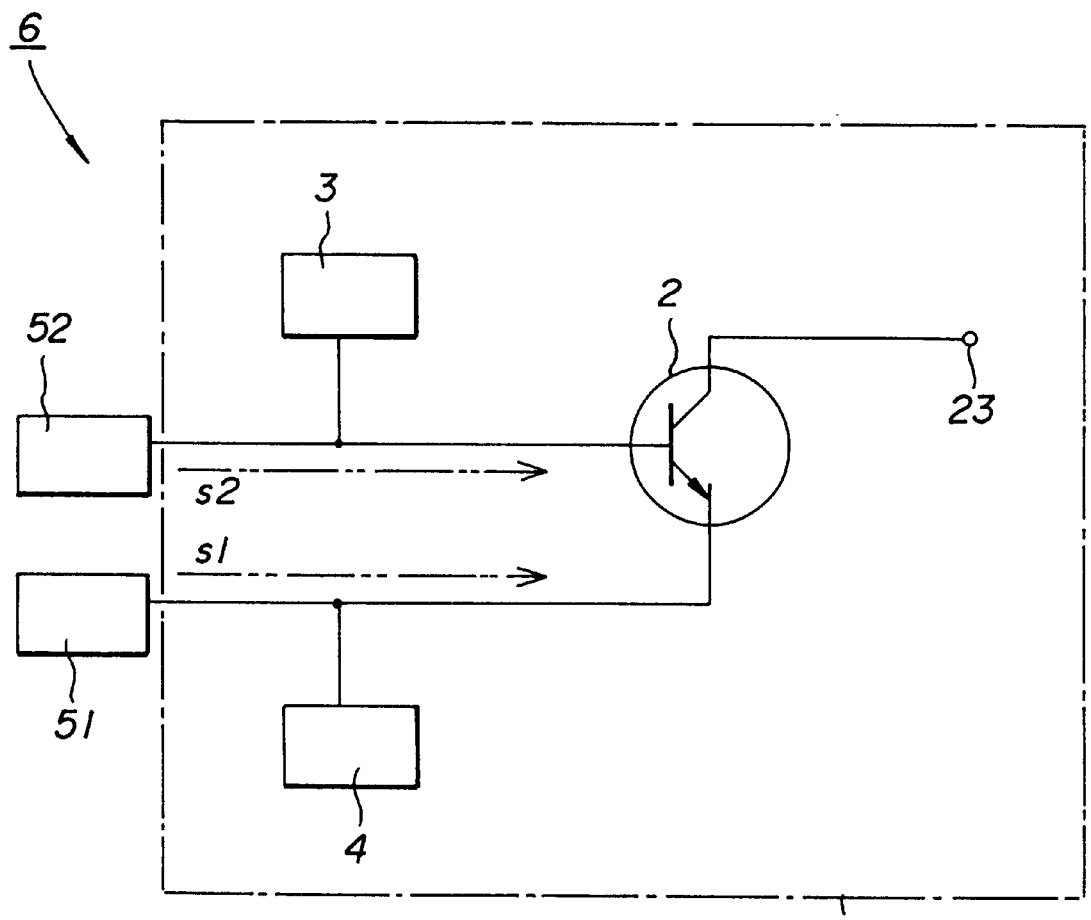
FIG. 4 is a block diagram showing an embodiment of a frequency change-over type oscillator according to the present invention.

FIG. 4 is used to indicate an embodiment showing a frequency change-over type oscillator 6, according to the present invention. In FIG. 4, some elements which are identical with or similar to those illustrated in FIG. 1 are represented by the same reference numerals, and the explanations thereof will be omitted.

As shown in FIG. 4, the frequency change-over type oscillator 6 comprises an input change-over type amplifier 1, a first signal source 51 connected to the emitter (serving as a first input terminal) of the transistor 2, a second signal source 52 connected to the base (serving as a second input terminal) of the transistor 2.

The frequency change-over type oscillator 6 having the above constitution is so formed that a signal s1 having a frequency f1 may be fed from the first signal source 51 into the emitter of the transistor 2, while a signal s2 having a frequency f2 may be fed from the second signal source 52 into the base of the transistor 2. However, at each time, only one of the signal s1 and s2 is input into the transistor 2. Here, with respect to an electric current having a frequency f1, the first grounding circuit 3 may be grounded at a high frequency. Accordingly, when the signal s1 is input into the emitter of the transistor 2, the transistor 2 may be grounded through its base. Similarly, with respect to an electric current having a frequency f2, the second grounding circuit 4 may be grounded at a high frequency, so that when the signal s2 is input into the base of the transistor 2, the transistor 2 may be grounded through its emitter.

In this way, since the frequency change-over type oscillator 6 having the above constitution is so formed that the first signal source 51 and the second signal source 52 are allowed to be input into different input terminals of the transistor 2, it can be made sure that one signal may be prevented from being fed into a signal source of the other signal before said one signal is fed into an input terminal of the transistor 2. As a result, it is sure to prevent an undesired decrease in the level of a signal being fed into an input terminal of the transistor 2.

Figure 5:
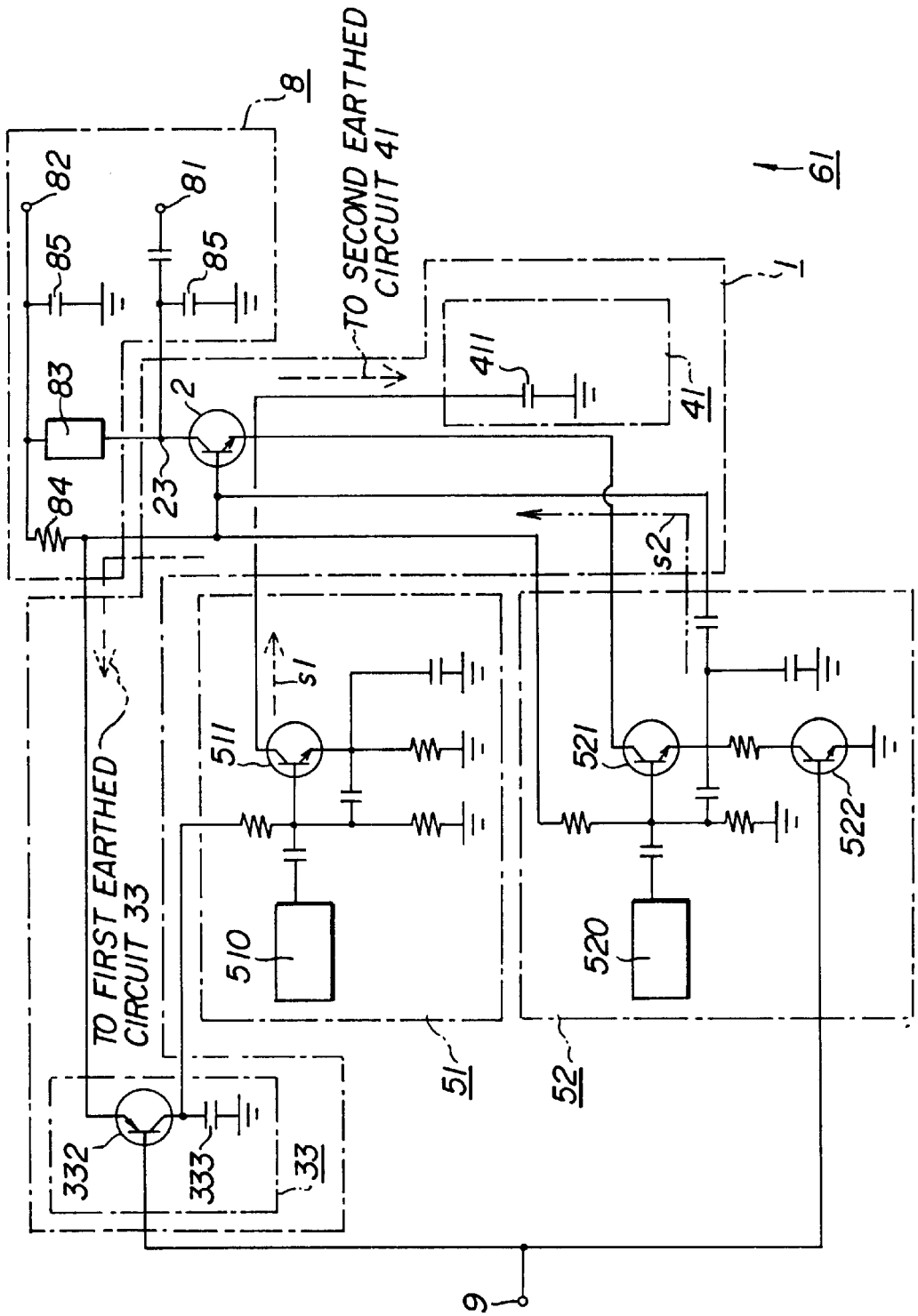
FIG. 5 shows a circuit showing another embodiment of a frequency change-over type oscillator according to the present invention.

FIG. 5 is used to indicate another embodiment showing a frequency change-over type oscillator according to the present invention. In FIG. 5, some elements which are identical with or similar to those illustrated in FIG. 4 are represented by the same reference numerals, and the explanations thereof will be omitted here.

As shown in FIG. 5, a frequency change-over type oscillator 61 comprises an input change-over type amplifier 1, a first signal source 51, a second signal source 52, a change-over signal input terminal 9 and an output circuit 8. A second grounding circuit 41 and the first signal source 51 are connected to the emitter of the transistor 2 (said emitter serves as a first input terminal for the transistor 2). A first grounding circuit 33 and the first signal source 52 are connected to the base of the transistor 2 (said base serves as a second input terminal for the transistor 2). The first signal source 51 has a resonance circuit 510 and a transistor 511 so as to form an oscillation circuit. The second grounding circuit 41 has the same structure as that of the grounding circuit 3 shown in FIG. 2A, including a capacitor 411. The second signal source 52 has a resonance circuit 520, a transistor 521, a transistor 522 serving as a switch member, thereby forming an oscillation circuit. The first grounding circuit 33 has the same structure as that of the grounding circuit 31 shown in FIG. 3, having a transistor 332 serving as a switch member and also having a ground capacitor 333. The output circuit 8 includes an output matching circuit comprising a terminal 81 for outputting a signal from the output terminal 23 of the transistor 2, a terminal 82 for supplying a bias voltage, capacitors 85 and 86, and a transmission line 83. The output circuit 8 also has a bias resistance 84.

In the following, a description will be given to an operation of the oscillator at a time when outputting a signal s1 having a frequency f1=1 GHz fed from the first signal source 51 and outputting a signal s2 having a frequency f2=2 GHz fed from the second signal source 52. Here, since the second grounding circuit 41 is so formed that its capacitor 41 has a sufficiently large impedance with respect to a current having a frequency f1=1 GHz, the second grounding circuit at this time can not be deemed to be grounded at a high frequency. On the other hand, with respect to a current having a frequency f2=2 GHz, since the capacitor 411 has a sufficiently small impedance, the second grounding circuit at this time can be deemed to be grounded at a high frequency. However, the self resonant frequency of the capacitor 411 is also allowed to substantially accord with f2=2 GHz. Further, since the ground capacitor 333 of the first grounding circuit 33 has a sufficiently small impedance with respect to an electric current having a frequency f1=1 GHz, the ground capacitor may be deemed to be grounded at a high frequency.

In use of the frequency change-over type oscillator 61, a high level or a low level switching signal voltage is applied to the change-over signal input terminal 9, so that either the transistor 522 or the transistor 332 serving as a switch member will be in its ON state.

At first, a high level change-over signal voltage is applied to the change-over signal input terminal 9, the transistor 332 is in its OFF state, so that the first grounding circuit 33 turns its non-grounded state. Then, with the first signal source 51, since the transistor 511 will become into its non-operative state, the signal s1 will not be inputted into the emitter of the transistor 2 from the collector of the transistor 511. Further, with the second signal source 52, the transistor 522 will become into its ON state and the transistor 521 will become into its operative state, so that the signal s2 will be inputted into the base of the transistor 2 from the emitter of the transistor 521. At this time, the second grounding circuit 41 connected with the emitter of the transistor 2 may be deemed to be grounded at a high frequency with respect to an electric current having a frequency f2=2 GHz. As a result, the transistor 2 is allowed to receive an input signal through its base and grounded through its emitter, thereby amplifying and outputting the signal s2 from the second signal source 52.

Then, a low level change-over signal voltage is applied to the change-over signal input terminal 9, the transistor 332 serving as a switch member will become into its ON state, so that the first grounding circuit 33 will become into its grounded state. Then, with the first signal source 51, since the transistor 511 will become into its operative state, the signal s1 will be fed from the collector of the transistor 511 into the emitter of the transistor 2. Further, with the second signal source 52, the transistor 522 serving as a switch member will become into its OFF state and the transistor 521 will become into its non-operative state, so that the signal s2 will not be fed from the emitter of the transistor 521 into the base of the transistor 2. At this time, the second grounding circuit 41 connected with the emitter of the transistor 2 may be deemed to be non-grounded at a high frequency with respect to an electric current having a frequency f1=1 GHz. As a result, the transistor 2 is allowed to receive an input signal through its emitter and grounded through its base, thereby amplifying and outputting the signal s1 fed from the first signal source 51.

In this way, with the use of the frequency change-over type oscillator 61 of the present invention, since the signal s1 and the signal s2 are fed into the transistor 2 through different paths, the signal s1 and the signal s2 may be smoothly fed into the transistor 2 without lowering the levels of these signals. Further, since it is possible to obtain an output having a high signal level, it facilitates to design an output matching circuit which is necessary for enhancing the stability with respect to an external load. Further, since it is not necessary to provide other matching circuit such as a trap circuit or a switch circuit at a connection point of the signal sources, it is allowed to reduce the number of required electronic parts, manufacture an oscillator which is compact in size, design a necessary circuit with only a shortened time.

In the above, although descriptions have been given using several circuit diagrams indicating several embodiments showing several frequency change-over type oscillators, the same description may also be used for explaining an input change-over type amplifier.

However, although in the above embodiments there has been given out a frequency combination including f1=1 GHz, and f2=2 GHz, this is nothing but an example. In fact, it is also possible to use other frequency combination.

Moreover, although an NPN transistor is used as an amplifying element in the above input change-over type amplifier and the above frequency change-over type oscillators, it is also possible to use a PNP transistor or an FET (Field Effect Transistor). Further, for use as the above transistor 332 and the above transistor 522 (all serving as switch member), it is also allowed to use other kind of transistor, FET, diode and the like. Further, as the first signal source 51 or the second signal source 52, it is allowed to use not only an oscillator having a fixed frequency, but also a voltage controlled oscillator. Moreover, an input change-over type amplifier of the present invention is also allowed to be an input change-over type amplifier having an amplification ratio of 1 or less.

With the use of the input change-over type amplifier according to the present invention, since two signals having different frequencies are allowed to be fed into an amplifying element through different paths, the two signals can be input smoothly into the amplifier without lowering the levels of these signals, thereby making it possible to obtain an output having a high signal level.

Further, with the use of the input change-over amplifier according to the present invention, since it is possible to obtain an output having a high signal level from the output terminal of an amplifying element, it is easy to design a matching circuit which is necessary for improving a stability with respect to an external load.

Moreover, with the use of the input change-over amplifier according to the present invention, since it is not necessary to provide other matching circuit such as a trap circuit or a switch circuit at a connection point of the signal paths, it is allowed to reduce the number of required electronic parts, manufacture an oscillator which is compact in size, design a necessary circuit with only a shortened time.

In addition, with the use of the grounding circuit of the input change-over type amplifier according to the present invention, since an impedance of a capacitor of a grounding circuit will change depending upon the frequency of a signal, an input terminal of an amplifying element connected with a grounding circuit may be used as a ground terminal or a non-ground terminal without having to use a switch member. Namely, when the impedance of a capacitor of a grounding circuit is sufficiently small, the input terminal of an amplifying element may be used as a ground terminal. On the other hand, when the impedance of a capacitor of a grounding circuit is sufficiently large, the input terminal of an amplifying element may be used as a non-ground terminal.

In fact, a frequency change-over type oscillator formed by using the above input change-over type amplifier has the similar effect as the input change-over type amplifier itself.

What is claimed is:

1. An input change-over type amplifier, comprising:
   an amplifying element having a first input terminal, a second input terminal, and one output terminal;
   a first grounding circuit which is connected to the second input terminal and is capable of being grounded at a high frequency with respect to the frequency of a signal being input into the first input terminal; and
   a second grounding circuit which is connected to the first input terminal and is capable of being grounded at a high frequency with respect to the frequency of a signal being input into the second input terminal, wherein said first and second grounding circuits have a same structure, wherein the first and the second grounding circuit includes a capacitor, and wherein a self-resonant frequency of the capacitor substantially corresponds to the frequency of a signal being input into the first or the second input terminal.

2. The input change-over type amplifier according to claim 1, wherein the first and the second grounding circuit includes a switch member.

3. A frequency change-over type oscillator, comprising:
   an input change-over type amplifier including
   an amplifying element having a first input terminal, a second input terminal, and one output terminal,
   a first grounding circuit which is connected to the second input terminal and is capable of being grounded at a high frequency with respect to the frequency of a signal being input into the first input terminal, and
   a second grounding circuit which is connected to the first input terminal and is capable of being grounded at a high frequency with respect to the frequency of a signal being input into the second input terminal, wherein said first and second grounding circuits have a same structure;
   a first signal source connected with the first input terminal; and
   a second signal source connected with the second input terminal.

* * * * *